(12) United States Patent
Henington et al.

(10) Patent No.: US 6,251,234 B1
(45) Date of Patent: Jun. 26, 2001

(54) ELECTROPLATING MACHINE

(75) Inventors: Paul Henington, Tsuen Wan; Kwok Wah Li, Tai Po; Kwok Wing Ng, Kwai Chung; Chi Chung Lee, Tsuen Wan, all of (HK); Pin Chun Huang; Fang Hao Lee, both of Taoyuan (TW); Marlin Vance Marsh, New Bedford; Carl John Colangelo, Framingham, both of MA (US)

(73) Assignees: Process Automation International, Ltd. (HK); Shipley Company, LLC, Marlborough, MA (US)

( * ) Notice: Subject to any disclaimer, the term of this patent is extended or adjusted under 35 U.S.C. 154(b) by 0 days.

(21) Appl. No.: 09/436,061

(22) Filed: Nov. 8, 1999

Related U.S. Application Data

(62) Division of application No. 09/143,045, filed on Aug. 28, 1998, now Pat. No. 6,174,417.

(30) Foreign Application Priority Data

May 20, 1998 (EP) .................................................. 98303984

(51) Int. Cl.[7] .............................. C25D 14/00; C25B 9/00; B01D 11/02
(52) U.S. Cl. .......................... 204/194; 422/275; 422/277; 422/278; 204/279
(58) Field of Search ................................... 422/276, 281, 422/261, 271, 274, 275, 277, 278; 204/260, 194, 279

(56) References Cited

U.S. PATENT DOCUMENTS

| | | | |
|---|---|---|---|
| 3,772,193 | * 11/1973 | Nelli et al. | 422/261 X |
| 3,975,242 | 8/1976 | Matsuda et al. | 298/28 |
| 4,102,772 | 7/1978 | Nakamura et al. | 204/206 |
| 4,119,516 | 10/1978 | Yamaguchi | 204/224 R |
| 4,260,468 | * 4/1981 | Bradley | 204/260 |
| 4,385,967 | 5/1983 | Brady et al. | 204/27 |
| 4,419,233 | * 12/1983 | Baker | 422/277 X |
| 4,459,183 | 7/1984 | Brady et al. | 204/27 |
| 4,584,066 | 4/1986 | Ando et al. | 204/28 |

(List continued on next page.)

FOREIGN PATENT DOCUMENTS

| | | |
|---|---|---|
| 473480 | 6/1974 | (AU) . |
| 1025794 | 2/1978 | (CA) . |
| 1132085 | 9/1982 | (CA) . |
| 1144522 | 9/1983 | (CA) . |
| 85106153 | 3/1987 | (CN) . |
| 2232047 | 7/1996 | (CN) . |
| 1174248 | 2/1998 | (CN) . |
| 1174249 | 2/1998 | (CN) . |
| 1174251 | 2/1998 | (CN) . |

(List continued on next page.)

Primary Examiner—Donald R. Valentine
(74) Attorney, Agent, or Firm—Fish & Neave

(57) ABSTRACT

An electroplating machine is disclosed as including an electrode positioning apparatus, an electrolyte delivery apparatus, an apparatus for covering a roller, an apparatus for dissolving copper oxide powder in an electrolyte passing through the apparatus, and an apparatus allowing the variation of the distance between two rollers. The electrode positioning apparatus has a first open end and a second end joined by two sets of connecting members, in which the connecting members in each set are parallel to one another and equally spaced from the adjacent member. The electrolyte delivery apparatus includes a pipe connected to a source of electrolyte and a nozzle through which the electrolyte is deliverable to an electrode mounted on the electrode positioning apparatus. The covering apparatus is elongate in shape and includes a cavity for accommodating a majority part of the outside surface of a roller. The apparatus for dissolving copper oxide powder in an electrolyte includes an upper chamber and a lower chamber.

13 Claims, 14 Drawing Sheets

U.S. PATENT DOCUMENTS

| | | | |
|---|---|---|---|
| 4,724,856 | 2/1988 | Pender | 134/122 R |
| 4,755,271 | 7/1988 | Hosten | 204/198 |
| 4,761,213 | 8/1988 | Hosten | 204/198 |
| 4,776,939 | 10/1988 | Bläsing et al. | 204/202 |
| 4,800,001 | 1/1989 | Ott et al. | 204/15 |
| 4,832,811 | 5/1989 | Hosten | 204/198 |
| 4,846,202 | 7/1989 | Kallweit | 134/122 R |
| 4,871,435 | 10/1989 | Denofrio | 204/224 R |
| 4,874,479 | 10/1989 | Haase et al. | 204/27 |
| 4,898,657 | 2/1990 | Hosten | 204/198 |
| 4,948,483 | 8/1990 | Hosten | 204/198 |
| 4,976,840 | 12/1990 | Hosten | 204/202 |
| 4,985,111 | 1/1991 | Ketelhohn | 156/640 |
| 4,986,888 | 1/1991 | Hosten et al. | 204/198 |
| 5,102,521 | 4/1992 | Usuda et al. | 204/198 |
| 5,211,826 | 5/1993 | Hosten et al. | 204/198 |
| 5,292,424 | 3/1994 | Bläsing et al. | 205/82 |
| 5,427,748 * | 6/1995 | Wiedrick et al. | 422/261 X |
| 5,553,700 | 9/1996 | Smith et al. | 198/780 |
| 5,643,425 * | 7/1997 | Amano et al. | 204/279 |

FOREIGN PATENT DOCUMENTS

| | | |
|---|---|---|
| 4324330 | 2/1994 | (DE) . |
| 0 032 530 | 7/1981 | (EP) . |
| 0 310 401 | 4/1989 | (EP) . |
| 0 732 424 | 9/1996 | (EP) . |
| 0 819 781 | 1/1998 | (EP) . |
| 1529188 | 10/1978 | (GB) . |
| 52-043733 | 4/1977 | (JP) . |
| 53-037545 | 4/1978 | (JP) . |
| 53-125942 | 11/1978 | (JP) . |
| 57-120690 | 7/1982 | (JP) . |
| 58-071396 | 4/1983 | (JP) . |
| 58-093897 | 6/1983 | (JP) . |
| 58-107496 | 6/1983 | (JP) . |
| 58-161792 | 9/1983 | (JP) . |
| 59-116398 | 7/1984 | (JP) . |
| 61-186498 | 8/1986 | (JP) . |
| 62-192600 | 8/1987 | (JP) . |
| 63-111196 | 5/1988 | (JP) . |
| 2228498 | 9/1990 | (JP) . |
| 3191090 | 8/1991 | (JP) . |
| 3236495 | 10/1991 | (JP) . |
| 4074896 | 3/1992 | (JP) . |
| 5-007471 | 1/1993 | (JP) . |
| 7268683 | 10/1995 | (JP) . |
| 8092783 | 4/1996 | (JP) . |
| 2529893 | 6/1996 | (JP) . |

* cited by examiner

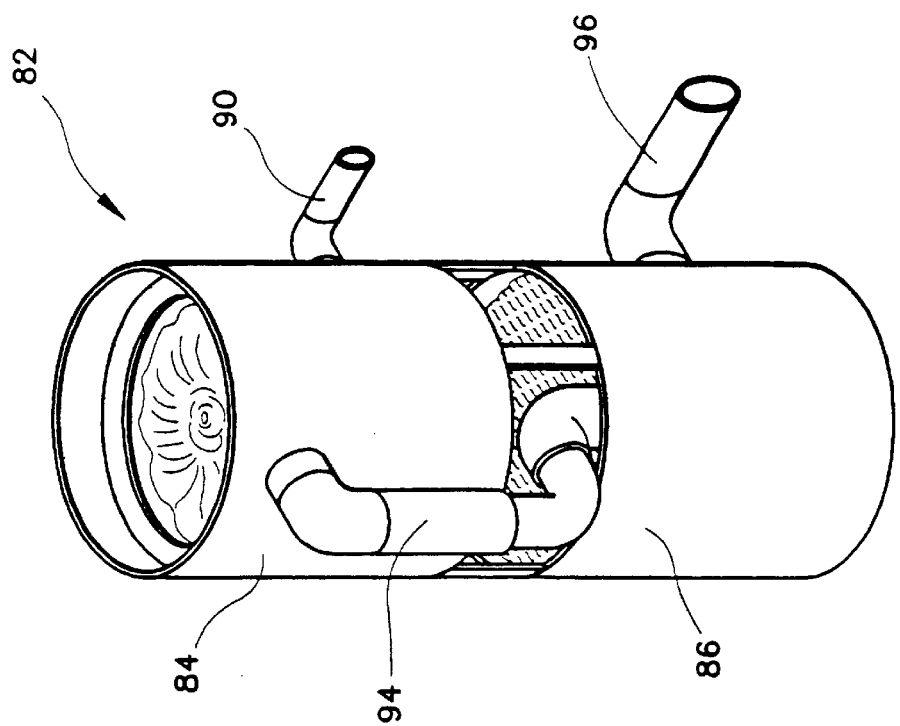
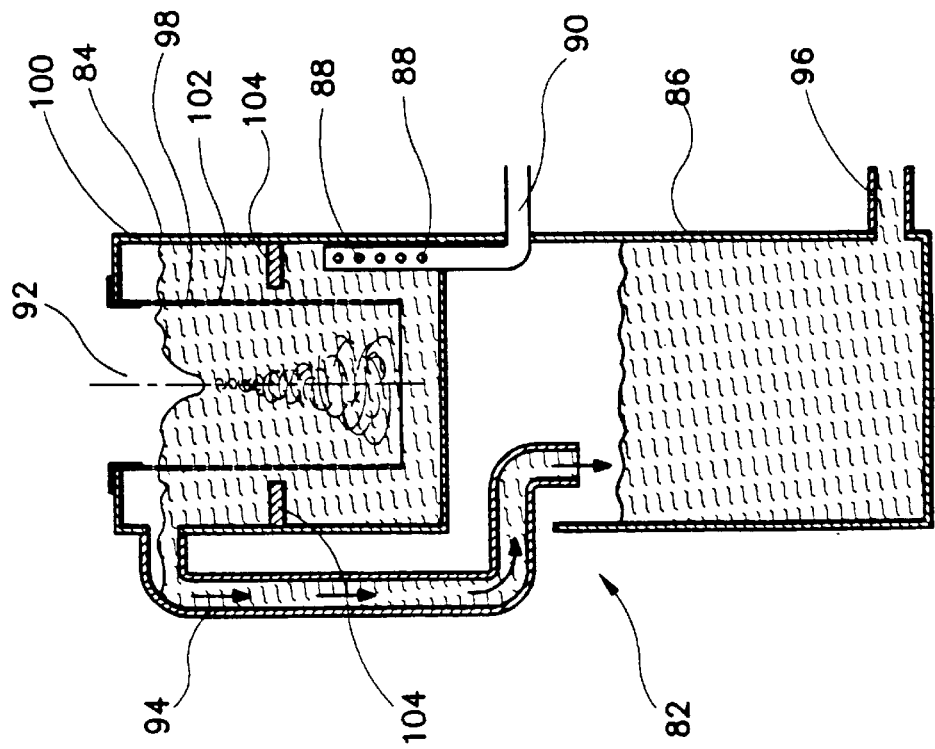
FIG.6B
FIG.6A

ELECTROPLATING MACHINE

CROSS-REFERENCE TO RELATED APPLICATION

This application is a divisional application of application Ser. No. 09/143,045 filed Aug. 28, 1998, now U.S. Pat. No. 6,174,417.

This invention relates to an electroplating machine, in particular such a machine for electroplating such substrates as printed circuit boards (PCBs).

In conventional electroplating machines, the substrates to be plated, e.g. PCBS, are usually positioned vertically, i.e. with their major surfaces facing sideward. The substrates are clamped either at their respective upper edge or lower edge, and lowered into a tank for treatment, or raised therefrom after such treatment. As a complete electroplating process includes a number of steps, including e.g. rinsing, electroplating, washing, etc., the substrates have to be transported from tank to tank. "Horizontal electroplating machines" have therefore been proposed, in which the substrates are positioned horizontally, i.e. with their major surfaces facing upward and downward. The substrates are caused to move relative to the machine from tank to tank along a substantially horizontal path to undergo the whole electroplating process.

It is an object of the present invention to provide a new horizontal electroplating machine, or at least to provide a useful alternative to the trade. Various other objects of the invention will be apparent from the following discussion.

According to a first aspect of the present invention, there is provided an apparatus for positioning an electrode for electroplating at least one substrate which moves relative to said apparatus, which apparatus comprising a first end and a second end wherein said first end is positionable nearer than said second end to the path of movement of said substrate relative to said apparatus, wherein said first end comprises a first side which is upstream of the movement of said substrate relative to said apparatus, characterized in that said first side curves towards said second end.

According to a second aspect of the present invention, there is provided an apparatus for positioning an electrode for electroplating at least one substrate which moves relative to said apparatus, comprising an end positionable near or adjacent to the path of movement of said substrate relative to said apparatus, said end including a first side which is upstream of, and a second side which is downstream of, the movement of said substrate relative to said apparatus, characterized in that said apparatus comprises at least a first member and at least a second member connecting said first and second sides and that said two connecting members are non-parallel to each other.

According to a third aspect of the present invention, there is provided an apparatus for positioning an electrode for electroplating at least one substrate which moves relative to said apparatus, comprising an end positionable near or adjacent to the path of movement of said substrate relative to said apparatus, said end including a first side which is upstream of, and a second side which is downstream of, the movement of said substrate relative to said apparatus, characterized in that said apparatus comprises at least a first set of plurality of electrically insulating members connecting said first and second sides which are substantially parallel to each other, and that all lines perpendicular to and joining said first and second sides, excluding any part overlapping with one or more of said connecting members, are of substantially the same length.

According to a fourth aspect of the present invention, there is provided a fluid delivery apparatus comprising a pipe member and a nozzle member, wherein said pipe member comprises an inlet for receiving fluid into said apparatus from an external source, and a plurality of holes allowing passing of said fluid into chamber means of said nozzle member, characterized in that said nozzle member comprises a substantially continuous elongated outlet which is in a fluid-communicable relationship with said chamber means, and through which outlet said fluid is deliverable out of said apparatus.

According to a fifth aspect of the present invention, there is provided an apparatus for covering a cylindrical object, which apparatus extending over at least substantially the whole length of said object, and including wall means for shielding at least part of the curved outer surface of said object, and a cavity for receiving at least part of said object, characterized in that said cavity is of a depth at least substantially the same as the diameter of said object for accommodating a majority part of said object, whereby said wall means shields a majority part of the curved outer surface of said object.

According to a sixth aspect of the present invention, there is provided an apparatus for mixing at least one solid chemical with a solution passing therethrough, which apparatus comprising a container with outer wall means, an input end for receiving a solution from an external source into said container, an output end for allowing said solution in said container to depart from said apparatus, and an opening for receiving said chemical into said container, characterized in that said container comprises inner porous wall means defining a cavity to which said solid chemical is receivable, and dividing means positioned between said outer wall means and said inner porous wall means.

According to a seventh aspect of the present invention, there is. provided an apparatus for mixing at least one solid chemical with a solution passing therethrough, which apparatus comprising a container with outer wall means and a longitudinal axis, an input end for receiving said solution from an external source into said container, an output end for allowing said solution to exit said apparatus, and an opening for receiving said chemical into said container, characterized in that said container comprises inner porous wall means defining a cavity to which said solid chemical is receivable, and that there are provided on said porous wall means at least a first aperture means and a second aperture means wherein each of said aperture means comprises at least one aperture, wherein the orientation between the longitudinal axis of the aperture of said first aperture means and a plane containing said respective aperture and said longitudinal axis of said container is different from the orientation between the longitudinal axis of the respective aperture of said second aperture means and a plane containing said respective aperture and said longitudinal axis of said container.

According to an eighth aspect of the present invention, there is provided an apparatus for allowing the variation of the distance between a first roller and a second roller, wherein each of said first and second rollers comprises an axle about which each respective roller is rotatable, said apparatus comprising a first body member having a first aperture for receiving at least one end of the axle of said first roller and thereby to allow said axle of said first roller to rotate therein, and a second body member comprising a second aperture for receiving at least one end of the axle of said second roller and thereby to allow said axle of said second roller to rotate therein, characterized in that said first roller is translationally movable relative to said second body member in response to entry of an article between said first and second rollers.

According to a ninth aspect of the present invention, there is provided an electroplating machine comprising one or more apparatus according to one or more of the above aspects of the present invention.

An embodiment of the present invention will now be described with reference to the accompanying drawings, in which:

BRIEF DESCRIPTION OF THE DRAWINGS

FIG. 6A is a sectional view of a mixing apparatus according to the present invention;

FIG. 6B is a perspective of the apparatus shown in FIG. 6A;

As shown in FIG. 1, a sectional side view of a portion of an electroplating machine according to the present invention, generally designated as 10, is shown. It should be understood that this figure only illustrates schematically the arrangement of the machine 10 according to the present invention. Some other component parts are therefore not shown, for clarity purposes. While the part of the portion of the machine 10 to the right of the broken line I—I is a tank 12 for containing a liquid, e.g. electrolyte, the part of the portion of the machine 10 to the left of the broken line I—I is outside the tank 12.

Figure 1:
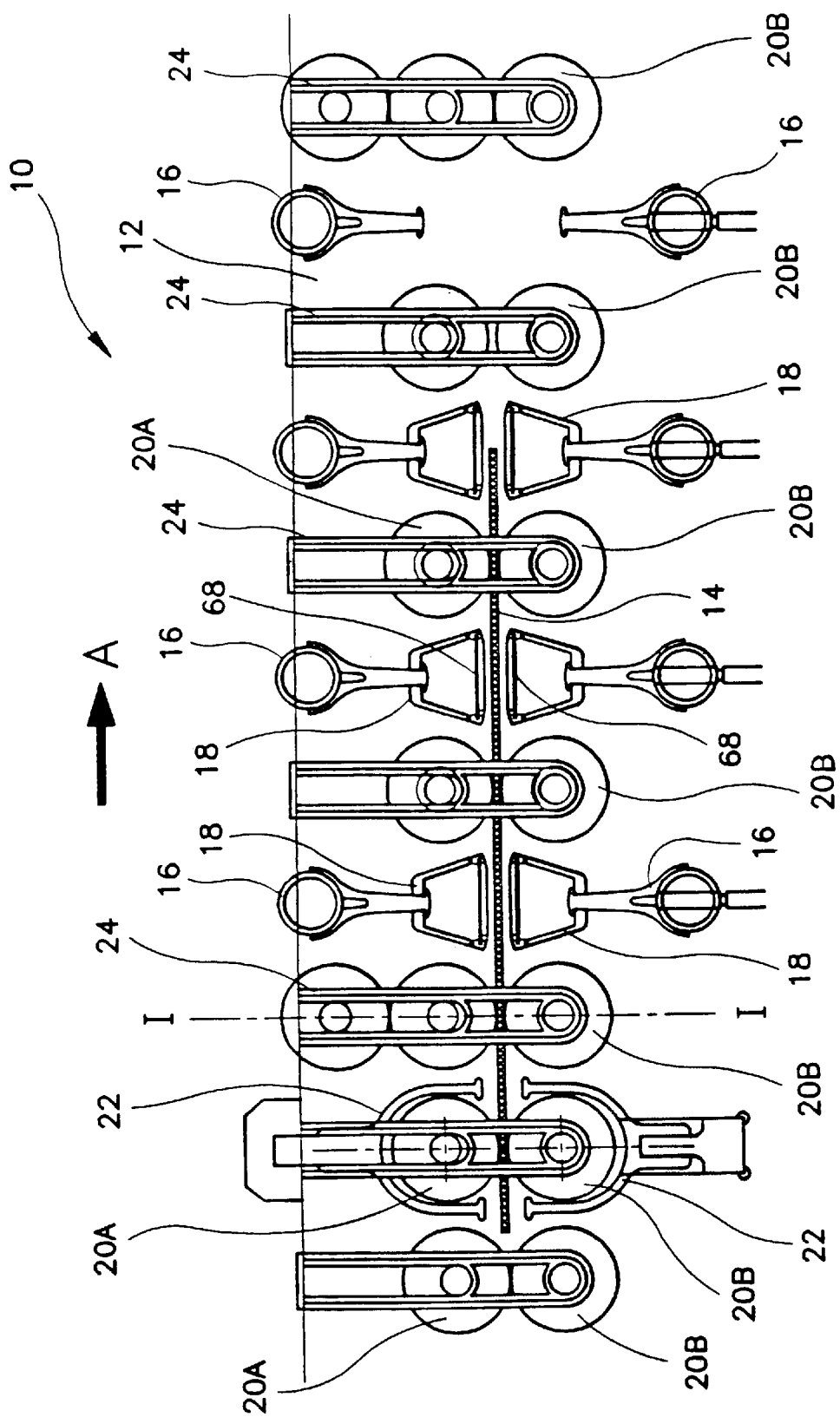
FIG. 1 is a schematic side view of an electroplating machine according to the present invention.

A printed circuit board (PCB) 14 (which acts as the cathode in the electroplating process) is shown as disposed horizontally and movable relative to the machine 10 in the direction shown by the arrow A. The machine 10 is shown as including a number of fluid delivery apparatus 16, some of which being coupled to an electrode positioning apparatus 18, a number of upper rollers 20A and lower rollers 20B, in which one upper roller 20A and one lower roller 20B are covered by a pair of covering apparatus 22, and a number of apparatus 24 each allowing the variation of the distance between a respective pair of rollers 20A and 20B.

Figure 2A:
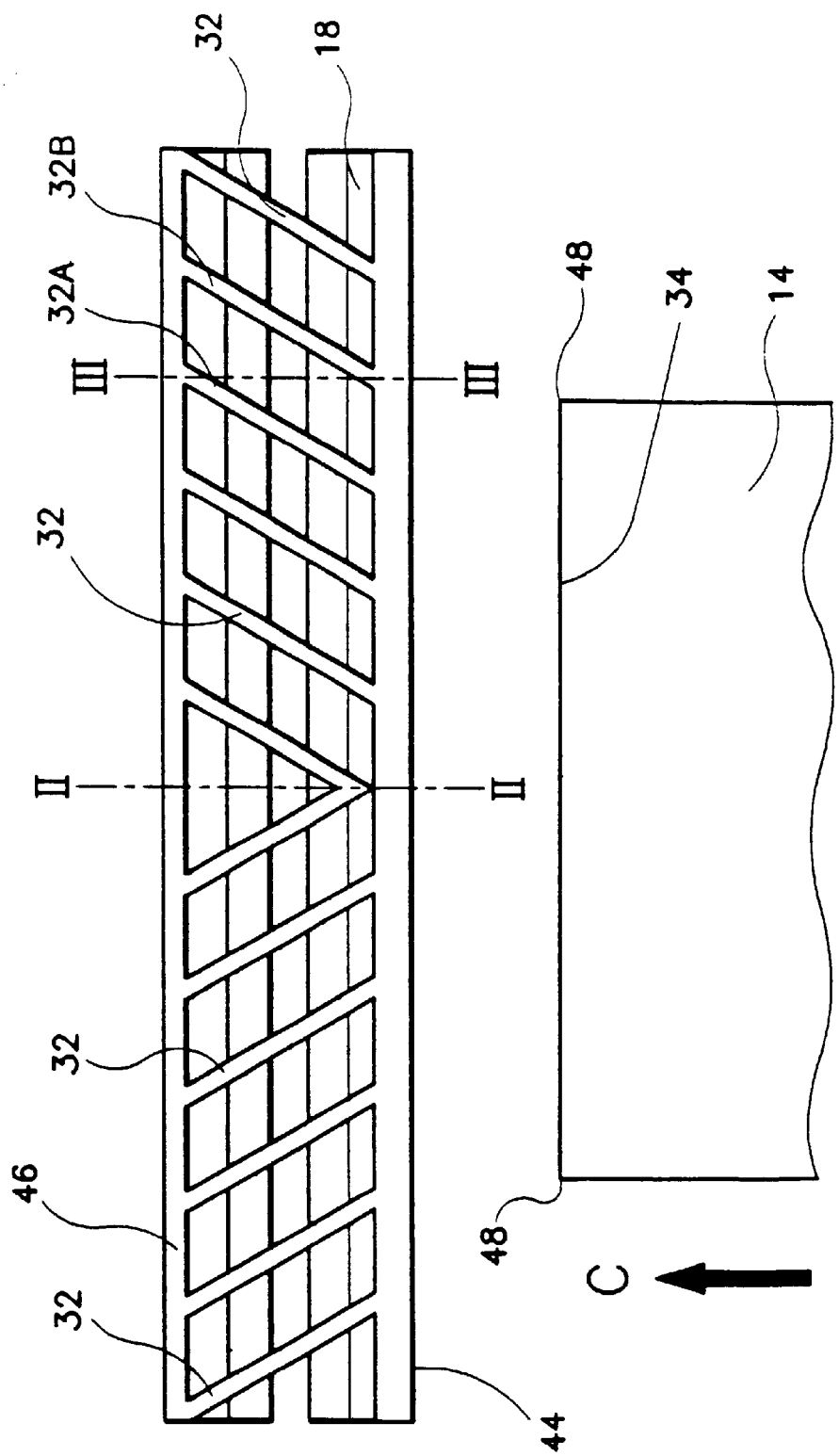
FIG. 2A is a bottom view of an electrode positioning apparatus according to the present invention.
Figure 2B:
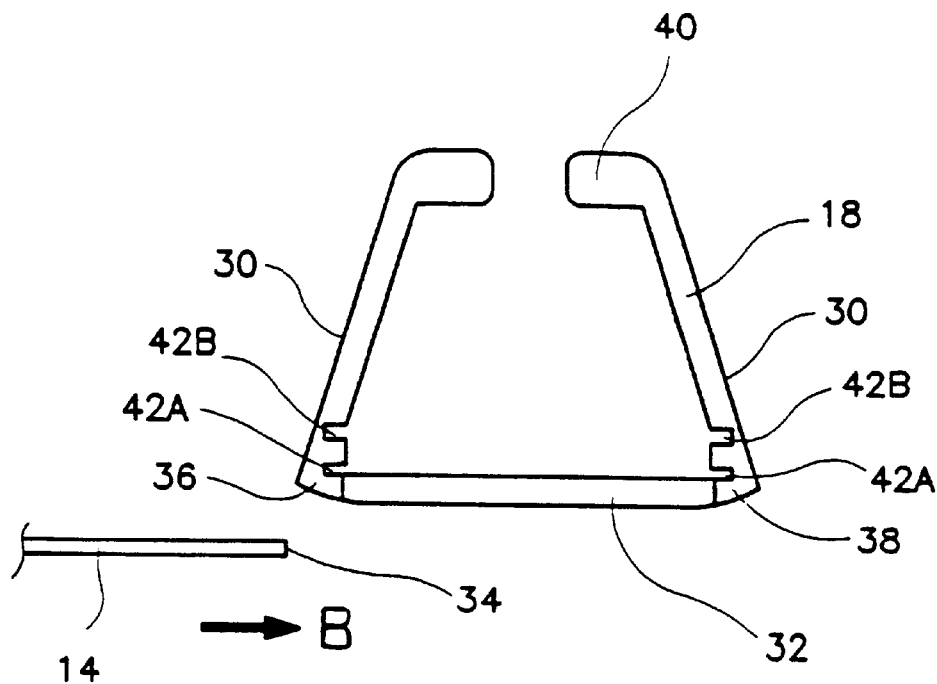
FIG. 2B is an end view of the apparatus shown in FIG. 2A.
Figure 2C:
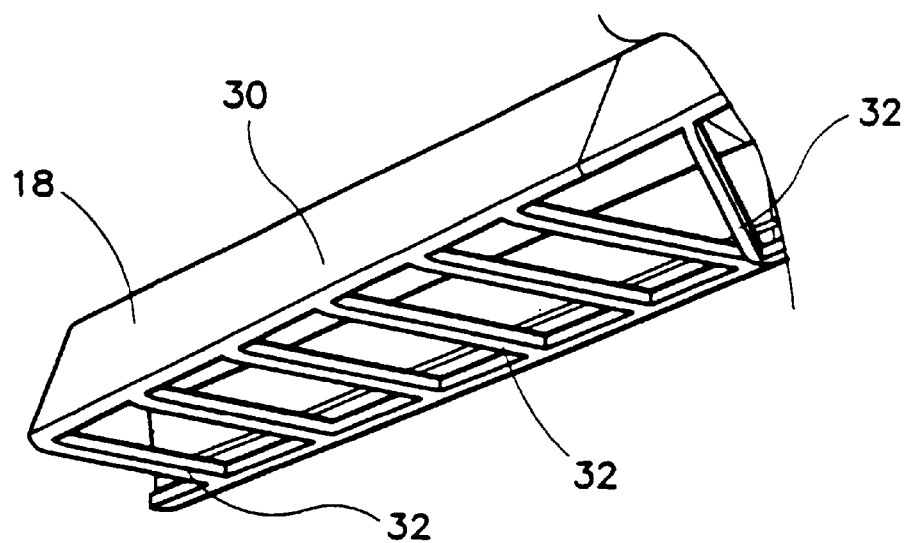
FIG. 2C is a bottom perspective view of the apparatus shown in FIG. 2A.

FIGS. 2A to 2C show an electrode positioning apparatus 18 according to the present invention, to which an electrode, e.g. anode, may be mounted in a manner to be discussed below. The positioning apparatus 18 is of a roughly trapezoidal shape in cross section, including two side walls 30 and a bottom side having a number of ribs 32 of equal width joining the two side walls 30. The side walls 30 and the ribs 32 are formed integrally with each other, and made of, e.g. high capacity polypropylene, an electrically insulating material.

The PCB 14 is shown in FIG. 2B as approaching the positioning apparatus 18 in the direction of the arrow B. As the PCB 14 may be very thin, and the liquid in the tank 12 may be moving at a very high speed, the leading edge 34 of the PCB 14 may flap vigorously, and may thus be jammed by the positioning apparatus 18. Both the upstream end 36 and the downstream end 38 of the bottom side of the positioning apparatus 18 therefore curve toward the opposite open side 40 of the positioning apparatus 18. Such an arrangement significantly reduces the chance of the leading edge 34 of the PCB 14 being jammed by the positioning apparatus 18.

The side walls 30 are provided with two opposite stepped portions 42A and two opposite slots 42B. All these stepped portions 42A and slots 42B are parallel to each other, and each for receiving a lateral end of an anode plate in a manner to be discussed below. Such an arrangement allows the anode plate to be engaged with the positioning apparatus 18 and positionable at different distances from its bottom side. The open side 40 of the positioning apparatus 18 is designed for engagement with a fluid delivery apparatus in a manner to be discussed below.

It can be seen clearly in FIG. 2A that the ribs 32 are arranged into two sets, in which all the ribs 32 in the same set are parallel to and equally spaced from each other. It can also be seen that the two sets of ribs 32 subtend an equal angle on opposite sides of a central axis II—II perpendicular to and joining parallel edges 44 and 46 of the bottom side of the positioning apparatus 18.

The positioning apparatus 18 is so arranged that the edge 44 is first encounterable by the leading edge 34 of the PCB 14 when the PCB 14 approaches the positioning apparatus 18 in the direction of the arrow C. As shown clearly in FIG. 2A, the two sets of ribs 32 slant away from the axis II—II in opposite directions, from the upstream edge 44 to the downstream edge 46 of the positioning apparatus 18. As mentioned earlier, the leading edge 34 of the PCB 14 may flap vigorously, and may thus be jammed by the positioning apparatus 18. The present arrangement ensures that even if the leading edge 34 of the PCB 14 so flaps, the two leading corners 48 will not be caught by the ribs 32, and thus jammed with the positioning apparatus 18.

Another feature relating to the arrangement of the ribs 32 is that all the lines joining the edges 44 and 46 and perpendicular thereto are blocked by the rib(s) 32 by an identical length. This means that the length of the lines not blocked by the rib(s) 32 are the same. This result is achieved by the way in which the ribs 32 are spaced from each other. Take ribs 32A and 32B as an example, it can be seen that the line III—III joining the mid-point of where the rib 32A joins the edge 46, and the mid-point of where the rib 32B joins the edge 44, is perpendicular to both the edges 44 and 46. The same arrangement applies to all other pairs of ribs 32. The purpose of such an arrangement is that provided the PCB 14 passes over or under the positioning apparatus 18 at a relatively constant speed, then, irrespective of the actual speed at which the PCB 14 travels, each point on the surface(s) of the PCB 14 will be exposed to the anode plate mounted in the positioning apparatus 18 for the same duration of time during the electroplating process. This will ensure that there will be no undesired uneven electroplating of the PCB 14.

Figures 3A, 3B:
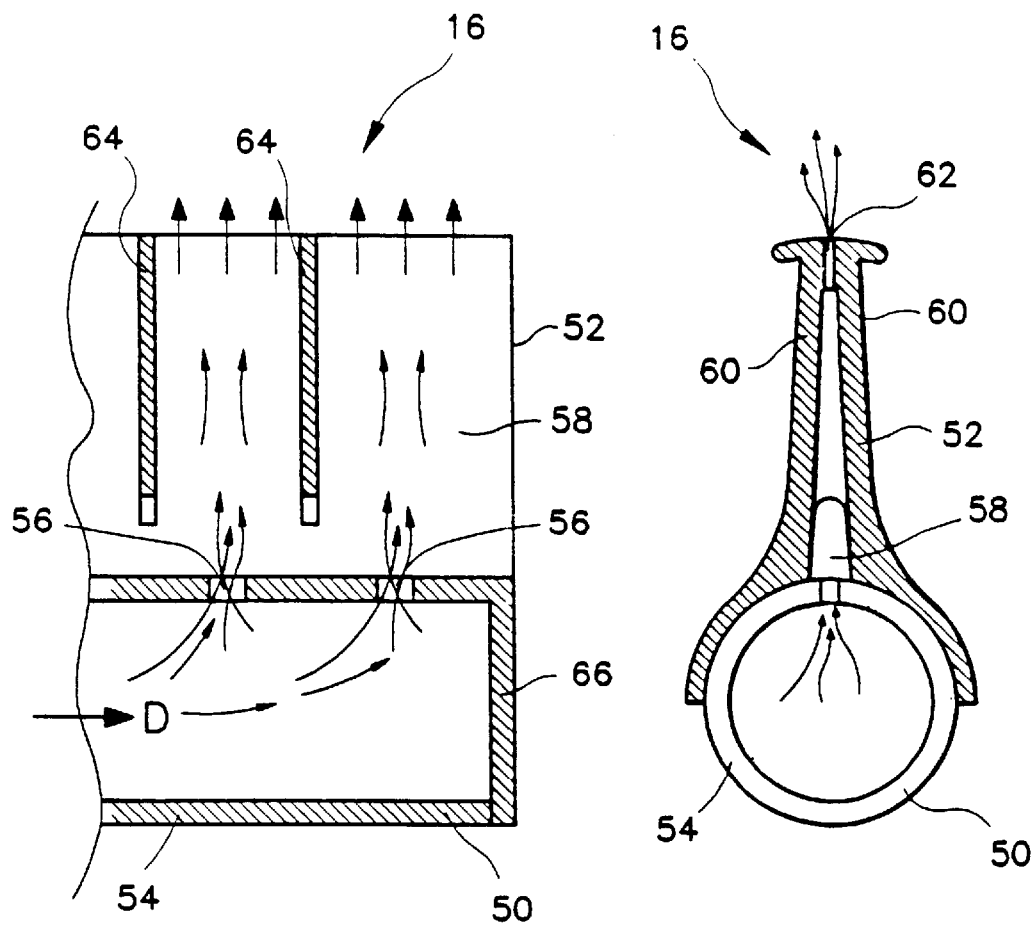
FIG. 3A is a partial sectional side view of a fluid delivery apparatus according to the present invention.
FIG. 3B is a sectional end view of the apparatus shown in FIG. 3A.
Figure 3C:
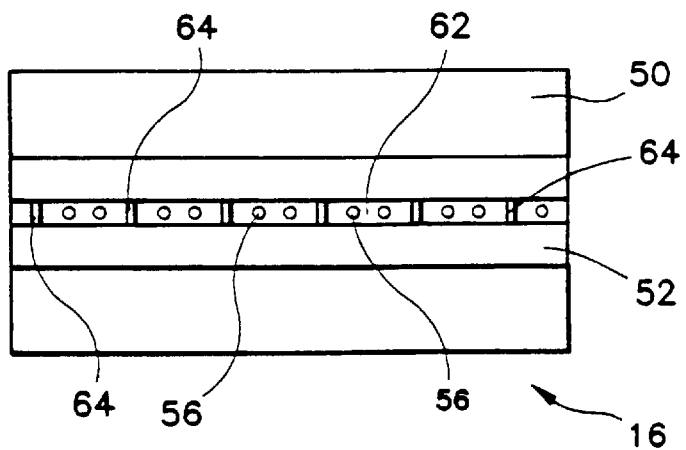
FIG. 3C is a top view of the apparatus shown in FIG. 3A.
Figure 3E:
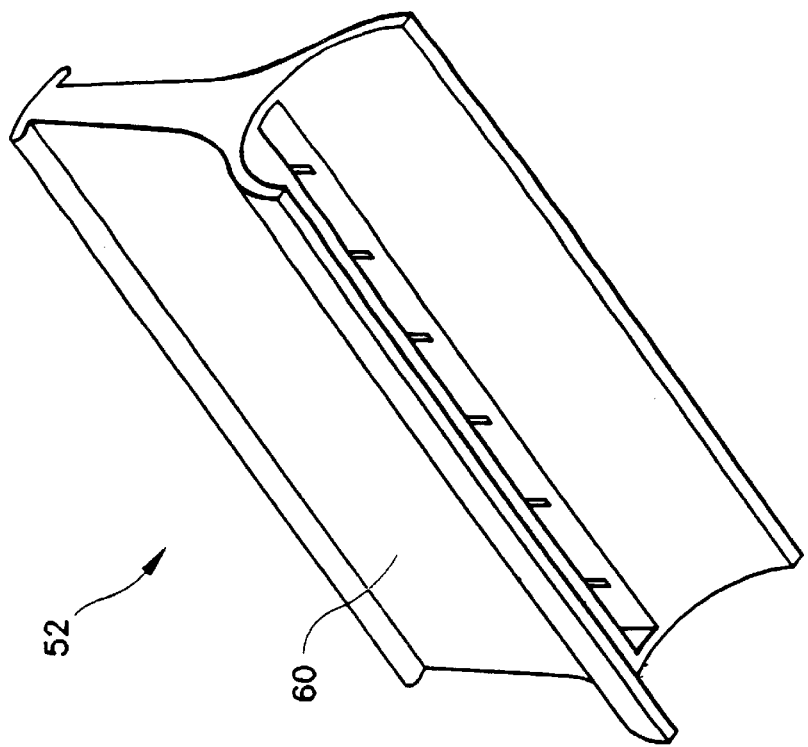
FIG. 3E is a bottom perspective view of the nozzle of the fluid delivery apparatus shown in FIG. 3D.
Figure 3D:
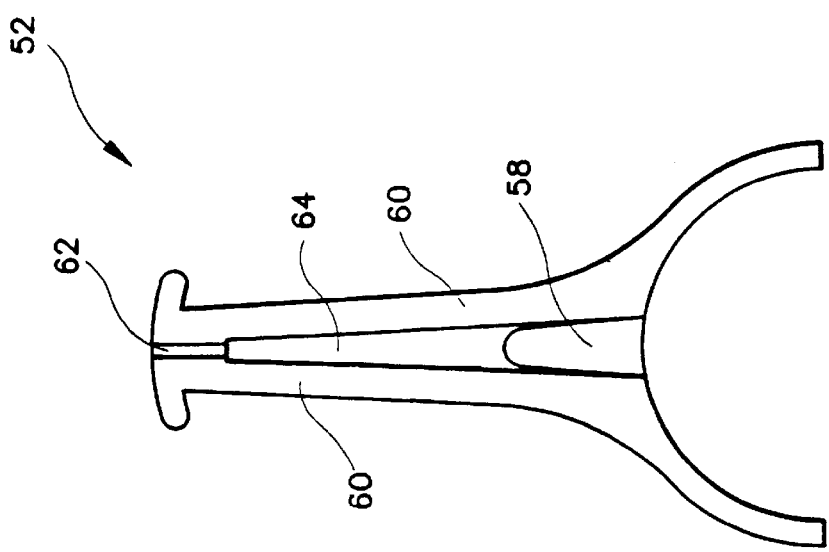
FIG. 3D is an end view of a nozzle of the fluid delivery apparatus shown in FIG. 3A.

FIGS. 3A to 3E show various views of the fluid delivery apparatus 16 shown in FIG. 1. The fluid delivery apparatus 16 includes two main components, namely an elongate pipe 50 and an elongate nozzle 52, which is of a generally Y-shaped cross-section, engaged with each other, either detachably or fixedly. The pipe 50 has a circular outer wall 54, provided with a number of holes 56 (of which only two are shown in FIG. 3A) opening to a cavity 58 formed between two halves 60 of the nozzle 52. As shown in FIG. 3C, the holes 56 are arranged along a straight line on the outer wall 54 of the pipe 50. The nozzle 52 includes an elongate and substantially continuous gap 62, interrupted by a number of thin partitions 64, of which two are shown in FIG. 3A. The partitions 64 are for joining the two halves 60 together and giving support to the nozzle 52. The partitions 64 also divide the cavity 58 of the nozzle 52 into a number of chambers.

During operation, fluid, e.g. an electrolyte for the electroplating process, may enter into the pipe 50 in the direction shown by the arrow D in FIG. 3A. Because of a closed end 66 of the pipe 50, the fluid is forced to pass through the holes 56 into the cavity 58 of the nozzle 58. Despite the existence of the partitions 64, the fluid exits the gap 62 continuously along the whole length of the gap 62.

Figures 4A, 4B:
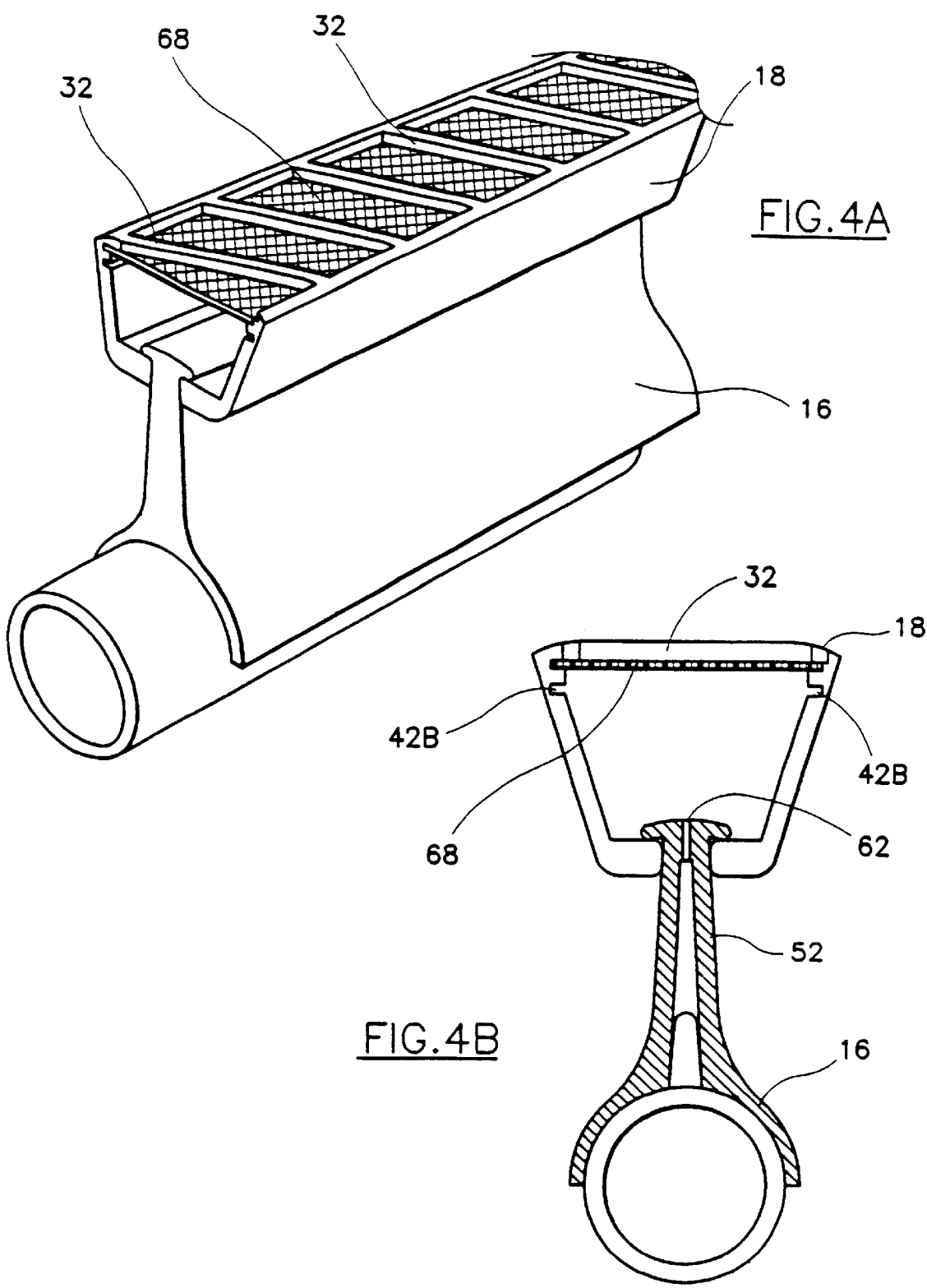
FIG. 4A is a partial perspective view showing the coupling of the electrode positioning apparatus shown in FIG. 2A and the fluid delivery apparatus shown in FIG. 3A.
FIG. 4B is a partial sectional end view showing the coupling of the electrode positioning apparatus and the fluid delivery apparatus as shown in FIG. 4A.

FIGS. 4A and 4B show the coupling of the fluid delivery apparatus 16 and the anode positioning apparatus 18. It can be seen that the fluid delivery apparatus 16 and the anode positioning apparatus 18 are slidably fitted to each other. In particular, the gap 62 of the nozzle 52 faces, and can thus direct a fluid towards, a porous metal plate 68, which may be made of titanium and acts as an anode in the electroplating process.

While in FIGS. 4A and 4B, the anode plate 68 is positioned very near to the ribs 32, the anode plate 68 can also be positioned farther away from the ribs 32 by being disposed between the slots 42B.

It is found in practice that the region adjacent to the anode plate 68 requires a higher rate of replenishment of electrolyte, and spent electrolyte should also be forced away from this region. The present arrangement between the fluid delivery apparatus 16 and the anode positioning apparatus 18 ensures that while fresh electrolyte can be delivered closely to the anode plate 68, spent electrolyte around this region can also be washed away by the jet of fresh electrolyte from the gap 62 of the nozzle 52.

Returning to FIG. 1, it can be seen that the PCB 14 can pass through a plurality of pairs of oppositely-facing anode positioning apparatus 18, in which the anode plates 68 are positioned close to the path of movement of the PCB 14. The present arrangement provides the following advantages:

(a) while the anode plates 68 can be positioned close to the path of movement of the PCB 14, there will be no direct contact between the anode plates and the PCB 14, which would result in undesired shorting of the circuit;

(b) the anode plates 68 can be positioned at different distances from the path of movement of the PCB 14, and the distance between the anode plates 68 and the PCB 14 can thus be varied; and (c) easy engagement and disengagement between the fluid delivery apparatus 16 and the anode positioning apparatus 18.

Figure 5A:
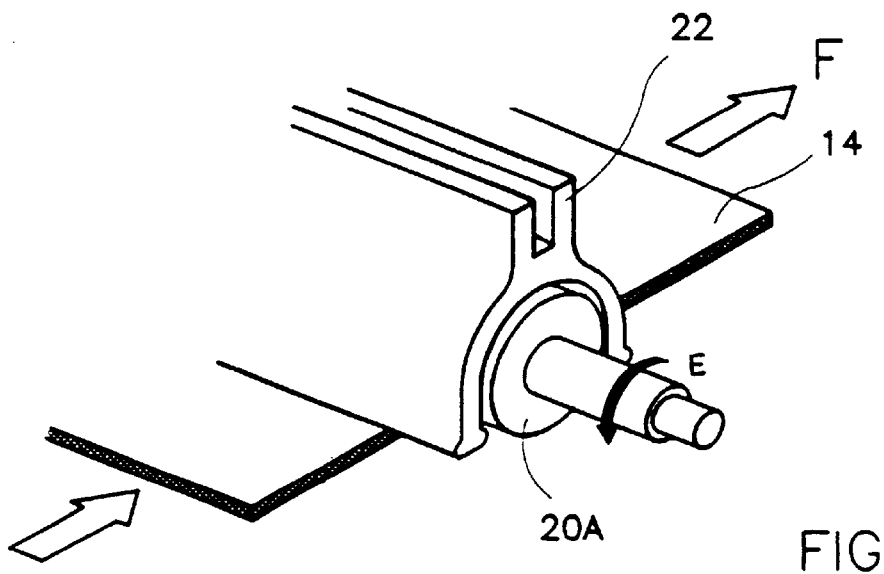
FIG. 5A is a partial perspective view showing an apparatus for covering a cylindrical object, according to the present invention.
Figure 5B:
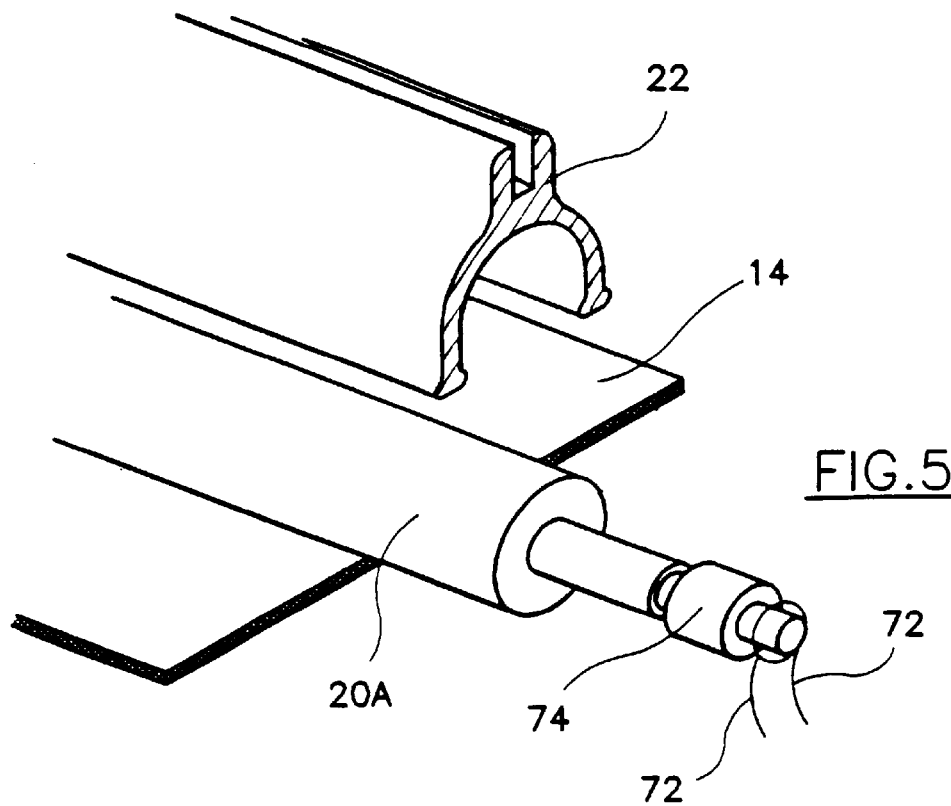
FIG. 5B is an exploded view of the arrangement shown in FIG. 5A.
Figure 5C:
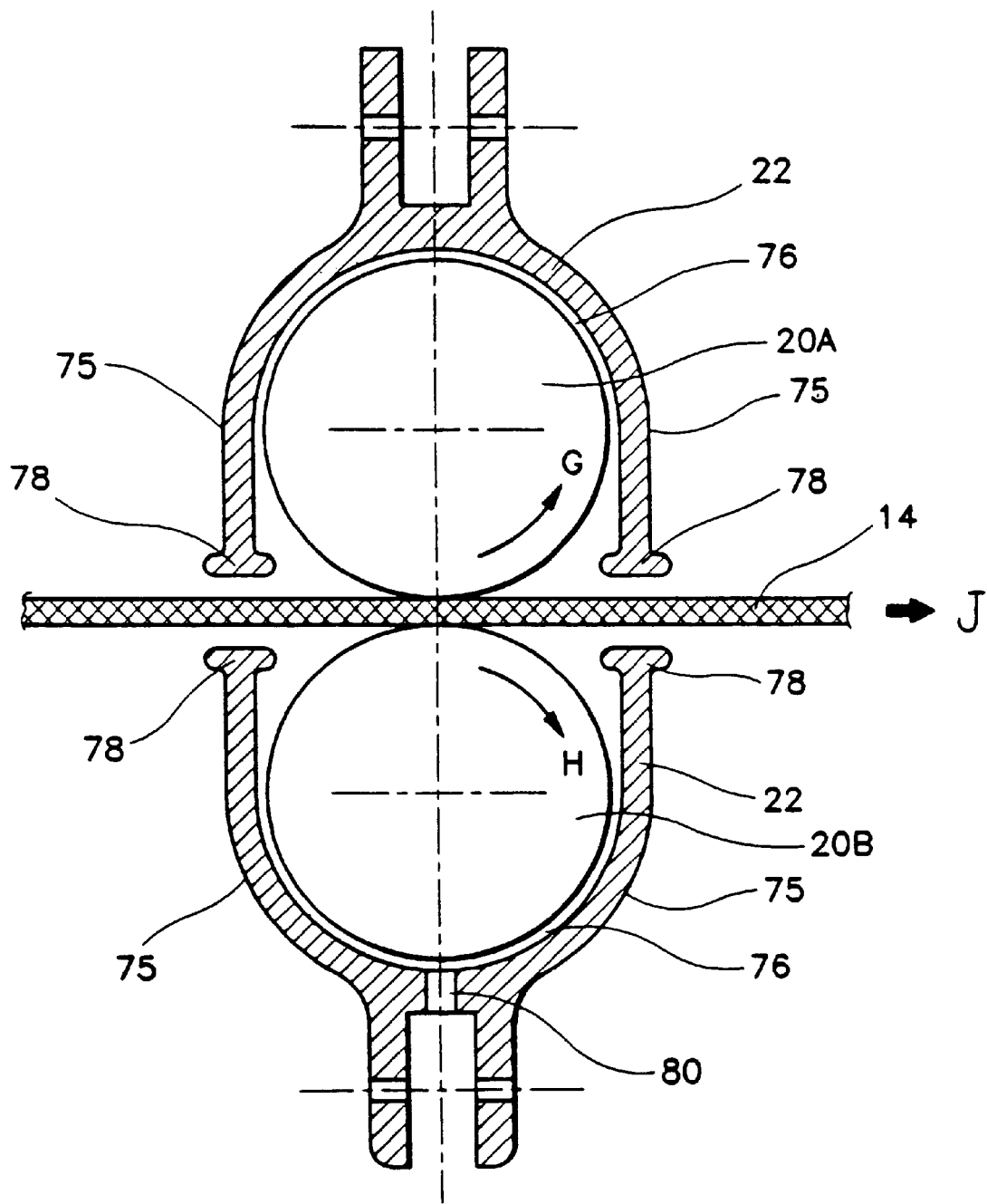
FIG. 5C is a sectional end view of a further arrangement of the covering apparatus as shown in FIG. 5A.

FIGS. 5A to 5C show the use of the covering apparatus 22 in the area outside of the tank 12. As mentioned earlier, the liquid in the tank 12 may, during operation of the machine 10, be moving at a very high speed. Traces of such liquid may therefore flood or spray out from the tank 12 and land on a metal roller 20A, thus establishing electrical connection, and causing the metal roller 20A to be electroplated undesirably. The covering apparatus 22 is therefore designed to protect the metal roller 20A from being so electroplated.

Electricity is supplied from an external source (not shown) to the metal roller 20A via wires 72 and a rotating current transfer device 74, which also permits the roller 20A to rotate in the direction of the arrow E shown in FIG. 5A. A separate rotating current transfer device at the opposite end of the roller 20A also causes the roller 20A to rotate in the same direction. The rotational movement of the roller 20A causes the PCB 14 to move in the direction of the arrow F in FIG. 5A. The electricity supplied from the external source is also transmitted to the PCB 14, thus allowing it to act as the cathode in the electroplating process. The covering apparatus 22 is elongate in shape and is made of, e.g. poly-vinylchloride, an electrically insulating plastic material.

As shown in FIG. 5C, in addition to the roller 20A, a metal roller 20B is provided beneath the path of movement of the PCB 14, each of the rollers 20A and 20B being protected by a covering apparatus 22. The covering apparatus 22 has two outer walls 75 (part of which being curved in cross-section along the whole length of the covering apparatus 22) and a cavity 76 of a depth roughly the same as the diameter of rollers 20A and 20B, so that the walls 75 can shield a majority part of the outer surface of the rollers 20A and 20B. In the arrangement shown in FIG. 5C, the roller 20A rotates in the direction shown by the arrow G, while the roller 20B rotates in the direction shown by the arrow H, in order to move the PCB 14 in the direction shown by the arrow J. It can also be seen that each of the covering apparatus 22 includes two leg portions 78, each being thicker than the thickness of the walls 75. The covering apparatus 22 positioned below the PCB 14 also includes a hole 80 allowing any stray liquid entering the cavity 76 to be drained out of the covering apparatus 22.

As discussed earlier, the tank 12 of the machine 10 contains electrolyte for use in and during the electroplating process. The concentration of, e.g. copper ions, in the electrolyte will decrease during the process, and ways have been devised to direct used electrolyte (i.e. electrolyte of a low copper ion concentration) away from the tank 12, to increase the concentration of copper ions of such electrolyte, and to pass such replenished electrolyte back into the tank 12. FIG. 6A is a cross-section, and FIG. 6B is a perspective view, of a mixing apparatus 82 used in the electroplating machine 10, for replenishing used electrolyte. The mixing apparatus 82 has an upper chamber 84 and a lower chamber 86. Electrolyte of a low copper ion concentration is pumped via outlets 88 of an input pipe 90 into the lower part of the upper chamber 84. Chemical in solid form, e.g. copper oxide powder, is poured into the upper chamber 84 through a top mouth 92, to be dissolved in the electrolyte. Electrolyte containing a higher concentration of copper ions leaves the upper chamber 84 via an output pipe 94 leading from the upper part of the upper chamber 84, enters into the lower chamber 86, and is led, e.g. pumped, away through a duct 96.

Contained within the upper chamber 84 is a porous pot 98 made of a chemical-resistant material, e.g. polyvinylchloride. The structure and function of the pot 98 will be discussed below. Positioned between the upper part and lower part of the upper chamber 84, and between a circular wall 100 of the upper chamber 84 and a wall 102 of the porous pot 98, is an annular ring 104.

Figure 6C:
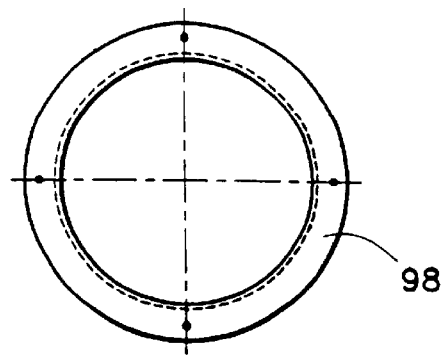
FIG. 6C is a top view of a porous pot used in the apparatus shown in FIG. 6A.
Figure 6D:
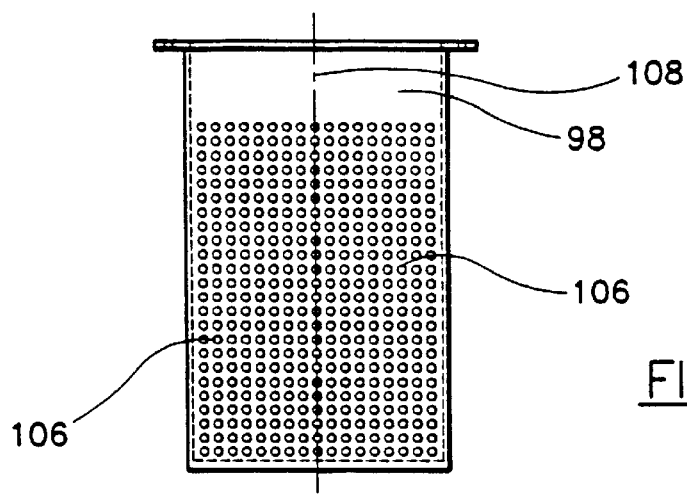
FIG. 6D is a side view of the porous pot shown in FIG. 6C.
Figure 6E:
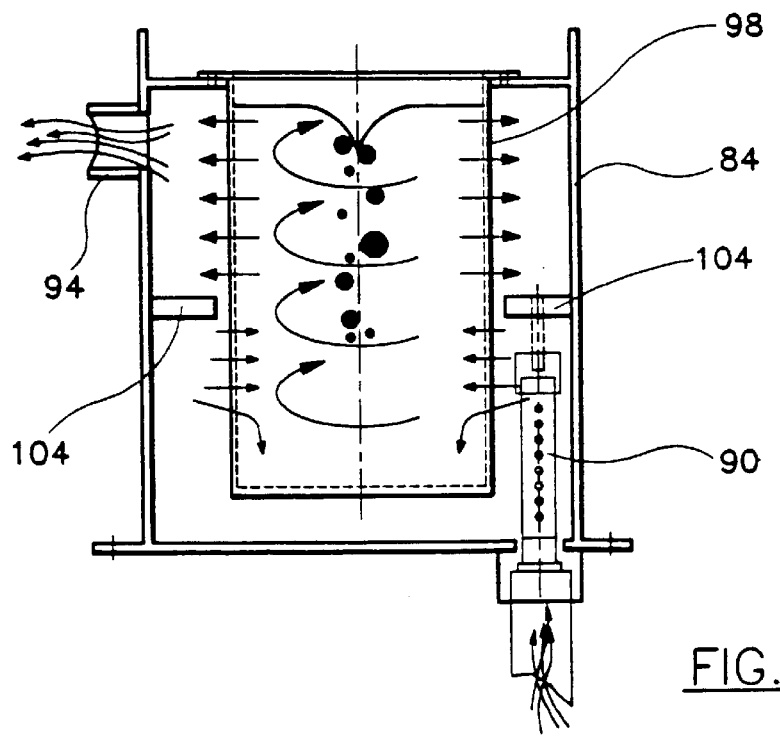
FIG. 6E is a sectional view of the top part of the apparatus shown in FIG. 6A during mixing operation.
Figure 6F:
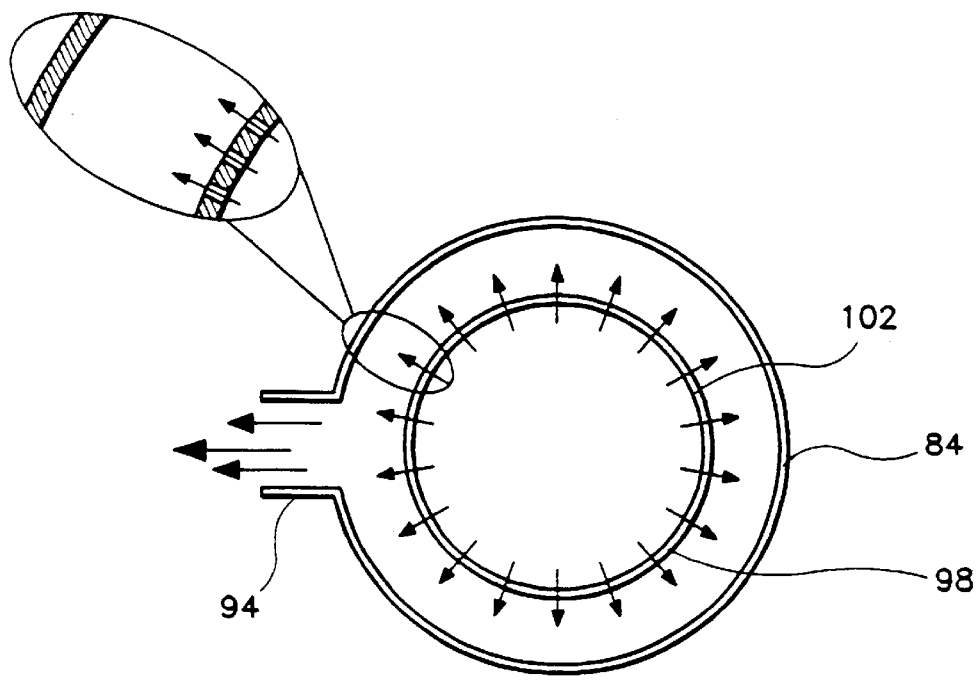
FIG. 6F shows the operation of the upper part of the porous pot shown in FIG. 6C.

As shown in FIGS. 6C and 6D, the porous pot 98 has a closed bottom and contains thirty-two rows of holes 106 on its wall 102. The top ten rows of holes 106 are so oriented that they face directly towards the central longitudinal axis 108 of the porous pot 98. As to the lower twenty-two rows of holes 106, they are oblique to the central longitudinal axis 108 of the porous pot 98 by 45°. The annular ring 104 is situated between the top tenth and eleventh rows of holes 106, i.e. between the two types of holes 106. FIG. 6F shows in more detail the orientations of holes 106 in the top ten rows on the wall 102 of the porous pot 98. The arrows show the directions in which replenished electrolyte leaves the inner cavity of the porous pot 98, and away from upper chamber 84 through the output pipe 94. It can be seen that the holes 106 in the top ten rows are so oriented that they face directly towards the central longitudinal axis 108 of the porous pot 98. Put another way, it can be seen that for the top ten rows of holes 106, the respective longitudinal axis of the holes 106 lies on the plane containing the central longitudinal axis 108 of the pot 98 and the respective hole 106, whereas for the lower twenty-two rows of holes 106, the respective longitudinal axis thereof is oblique to, and thus intersects, a plane containing the central longitudinal axis 108 of the pot 98 and the respective hole 106, at 45°.

Figure 6G:
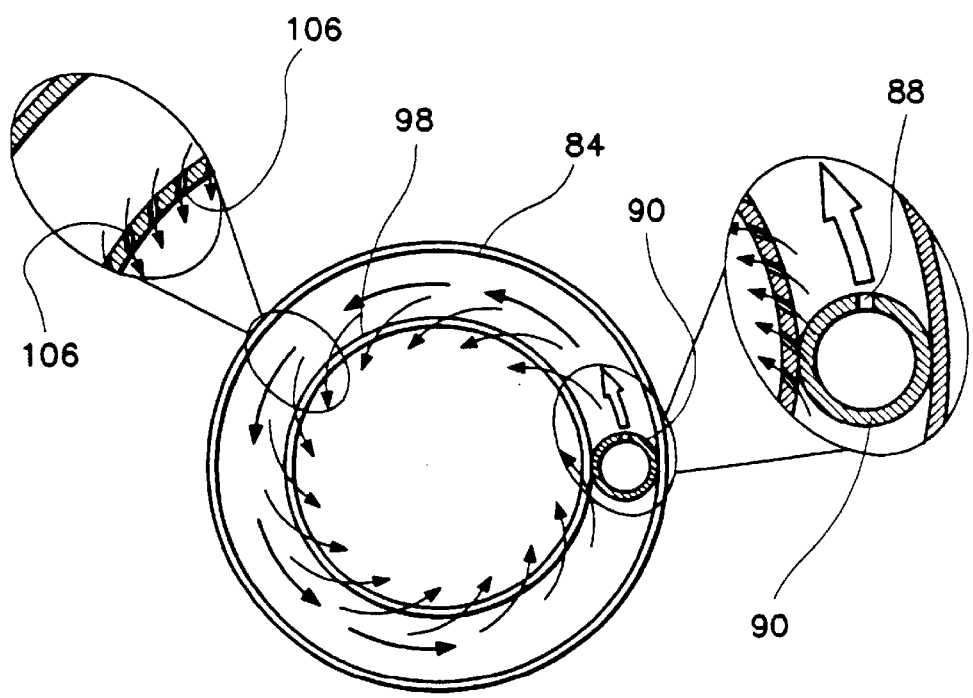
FIG. 6G shows the operation of the lower part of the porous pot shown in FIG. 6C.

As shown in FIG. 6G, the electrolyte low in copper ion concentration enters the upper chamber 84 in a high-speed jet through holes 88 (of which only one is shown here) of the input pipe 90. It can be seen that the electrolyte is introduced into the upper chamber at right angle to a plane containing the longitudinal axis 108 of the porous pot 98 and the vertical part of the input pipe 90. It can be seen that by way of such an arrangement, the electrolyte will circulate in the upper chamber 84, thus causing a vortex, as shown in FIGS. 6A, 6B and 6E. The existence of such a vortex will ensure that the solid chemical, i.e. copper oxide powder in the present example, will stay in the vortex until totally dissolved in the electrolyte. This will enhance the dissolution of the copper oxide powder in the electrolyte, and ensure that no undissolved copper oxide powder can leave the upper chamber 84.

The formation of such a vortex is enhanced by the following additional factors:

(A) since the bottom twenty-two rows of holes 106 are oblique to the central longitudinal axis 108 of the porous pot 98 by 45°, the electrolyte can only enter into the inner cavity of the porous pot 98 at such an angle; and (B) the annular ring 104 also enhances the formation and maintenance of such a vortex.

It should also be noted that the concentration of chemical in the electrolyte leaving the upper chamber 84 can be adjusted by varying the feed rate of the solid chemical into the upper chamber 84.

It is commonly known that substrates, e.g. PCBs 14, to be electroplated may be of various thickness. Electroplating machines should therefore be sufficiently versatile to accommodate substrates of a reasonable range of thickness. FIGS. 7A to 7D show an apparatus 24 allowing the variation of the distance between two oppositely facing rollers, in response to the thickness of substrates to be moved therebetween.

Figure 7A:
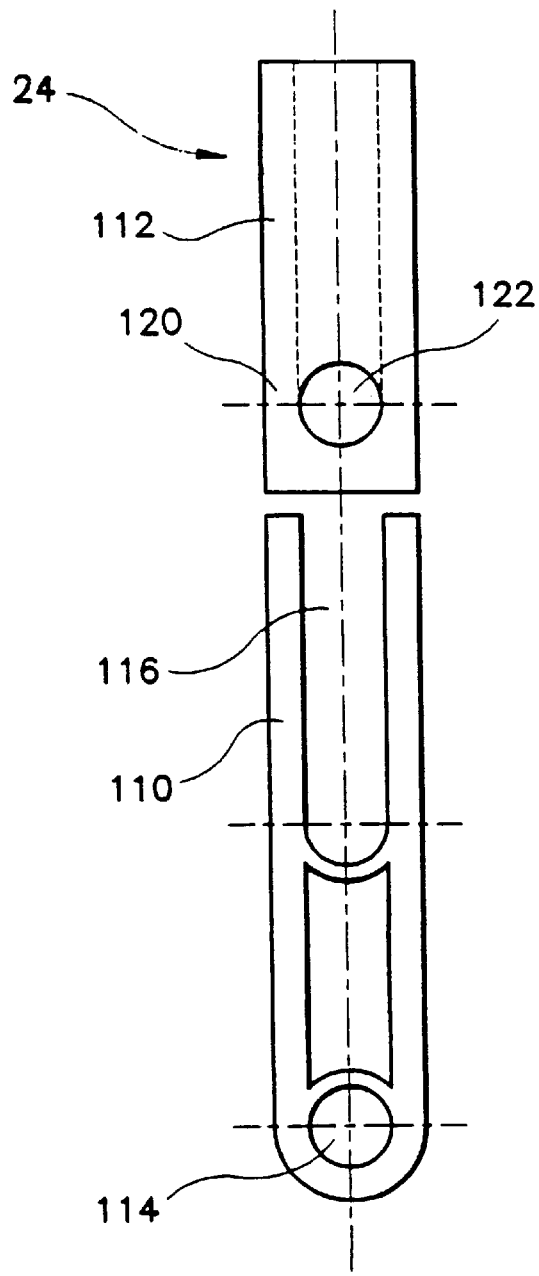
FIG. 7A shows the front view of an apparatus for allowing the variation of the distance between two rollers.
Figure 7B:
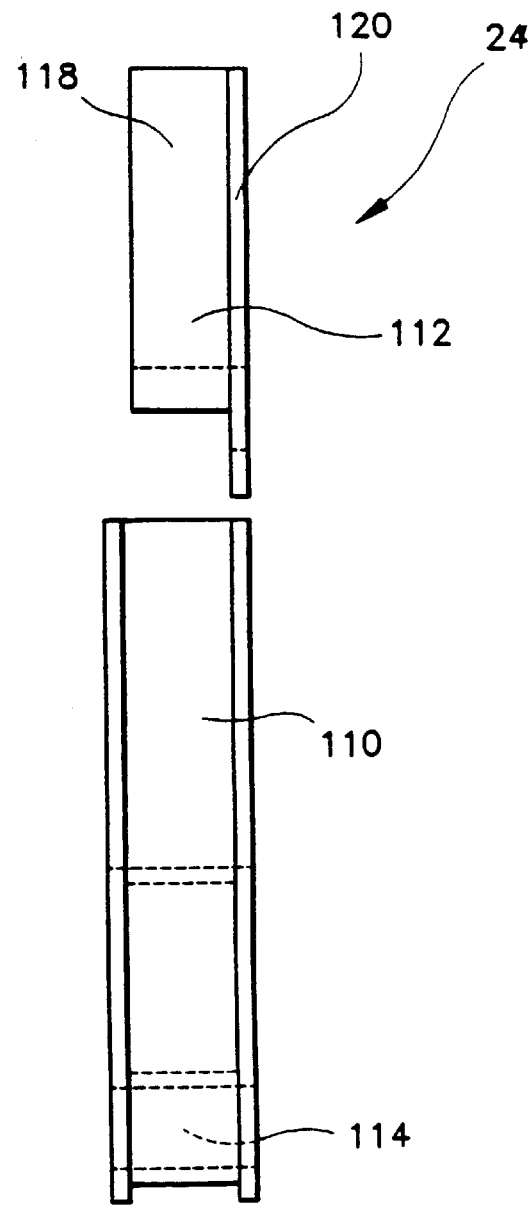
FIG. 7B shows the side view of the apparatus shown in FIG. 7A.
Figure 7C:
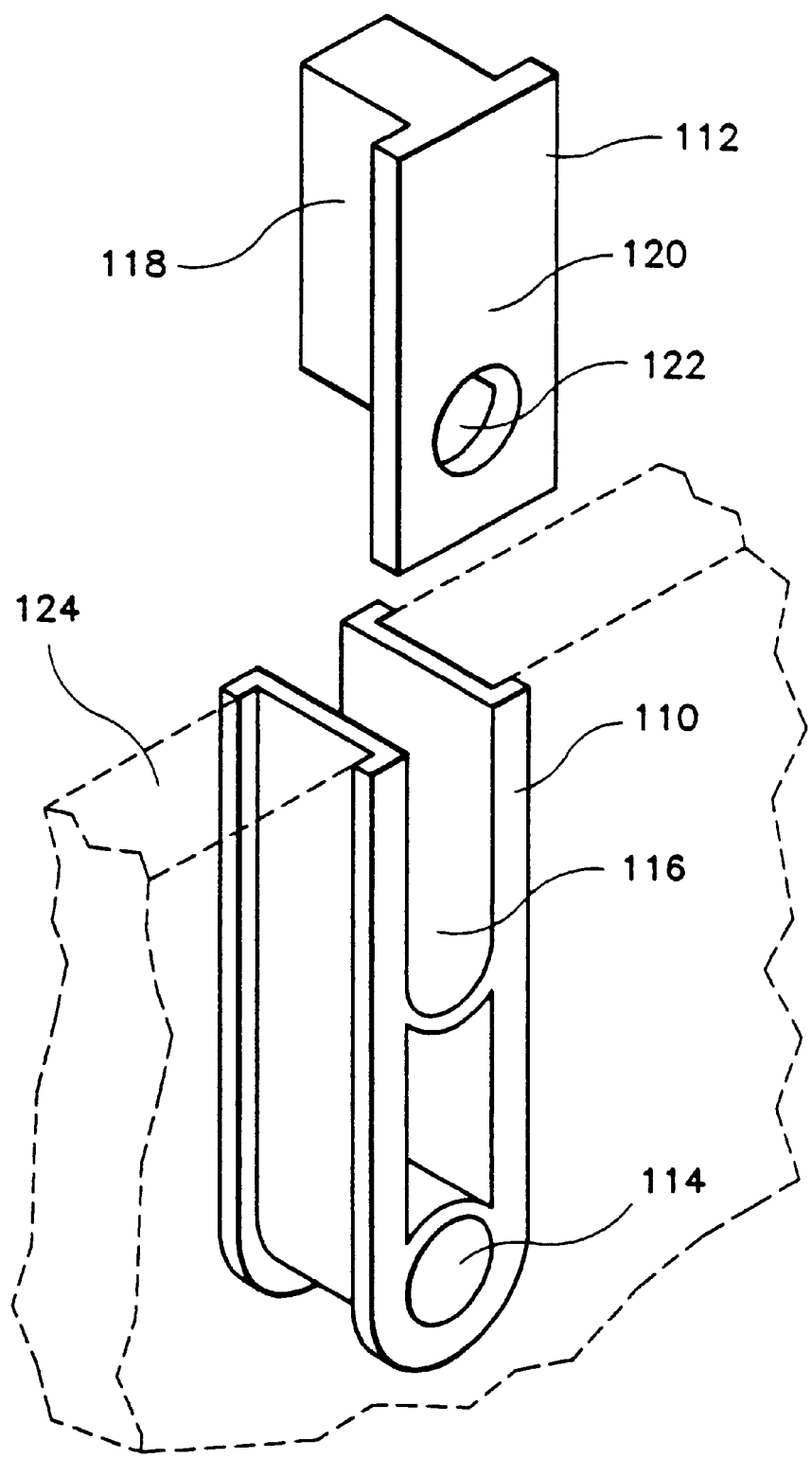
FIG. 7C shows a partial exploded view of the apparatus shown in FIG. 7A as engaged with a wall of another article.

The apparatus 24 is made up of a primary part 110 and a secondary part 112. The primary part 110 is substantially elongate in shape, with a cylindrical hole 114 at one end, and an elongate opening 116 at the other end. As to the secondary part 112, such includes a main body 118 and a tongue portion 120, integrally formed with each other. There is also provided a hole 122 on the tongue portion 120. The main body 118 of the secondary part 112 is receivable within the opening 116 of the primary part 110, so as to allow the secondary part 112 to slide relative to the primary part 110. The tongue portion 120 is wider than and extends below the elongate opening 116 (see FIG. 7D), so that when the primary part 110 and the secondary part 112 are engaged with each other, the tongue portion 120 can cover the elongate opening 116. As can be seen in FIG. 7C, the primary part 110 may be fixedly secured to a wall 124 of a machine, e.g. the electroplating machine 10.

Figure 7D:
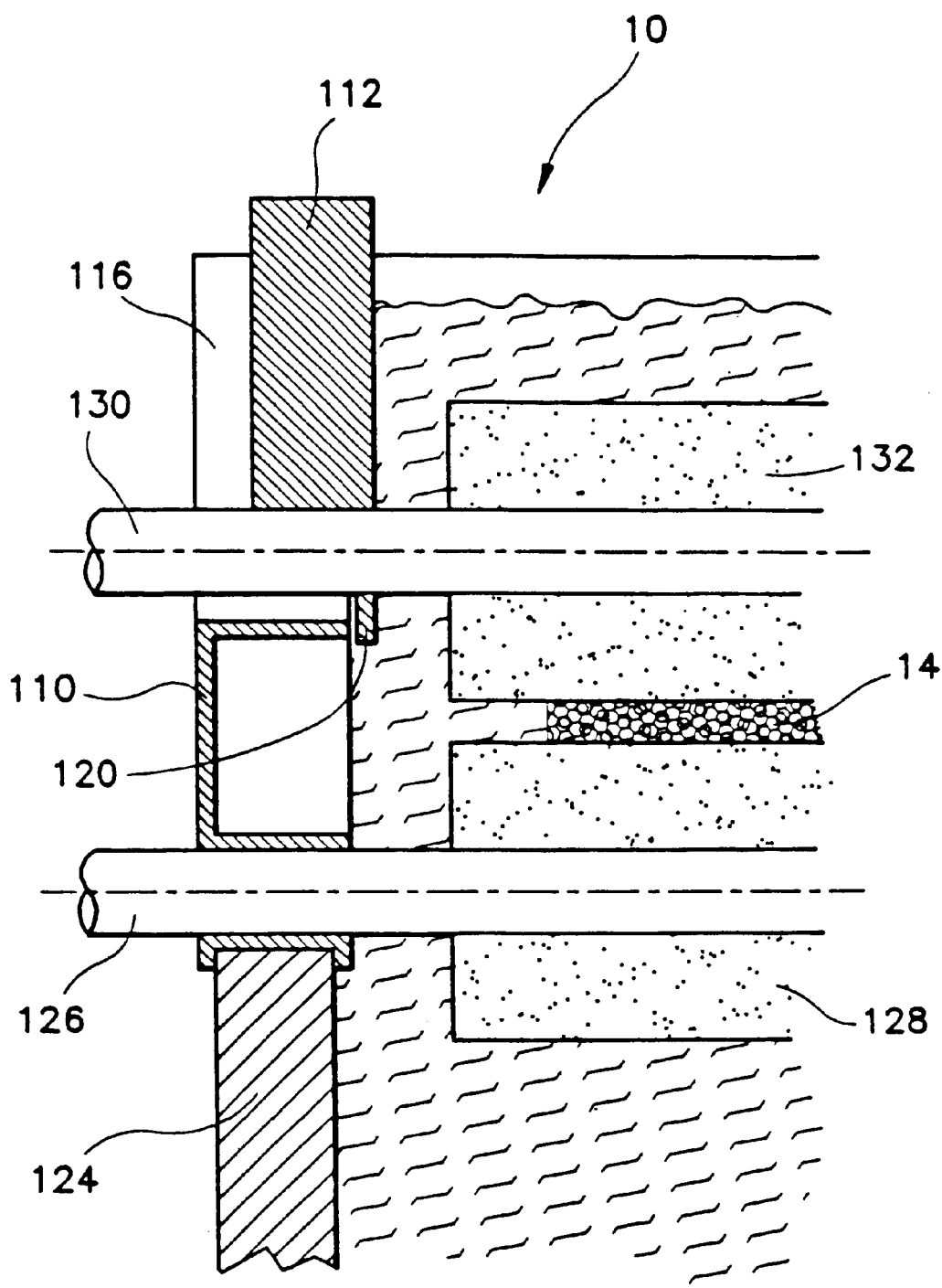
FIG. 7D shows the apparatus shown in FIG. 7A as used with two rollers.

In use, and as shown in FIG. 7D, an axle 126 of a lower roller 128 is received through the hole 114 of the primary part 110, and extends through the wall 124 of the machine 10. The axle 126 and the hole 114 of the primary part 110 are sized such that when the axle 126 is received within the hole 114, the contact area is water-tight, so that the electrolyte cannot escape from the machine 10. It should also be understood that only one side of the relevant part of the machine 10 is shown here, and that there is a similar arrangement on the opposite side of the relevant part of the machine 10. The lower roller 128 can therefore rotate about its axle 126. Similarly, an axle 130 of an upper roller 132 is received through the hole 122 on the tongue portion 120 and the elongate opening 116 of the primary part 110. The upper roller 132 can therefore also rotate about its axle 130, and their contact area is also water-tight. It should be noted that the two axles 126 and 130 are parallel to each other, and lie on a common vertical plane. The arrangement that the axles 126 and 130 extend through the wall 124 of the machine 10 may be required when the rollers 128 and 132 need to be driven by, e.g. a motor, external to the tank 12, or to be in electrical contact with an external source of electricity.

When there is no article between the rollers 128 and 132, the upper roller 132 is at its lowest position and contacts the lower roller 128. When, however, a PCB 14 moves between the rollers 128 and 132, it forces the upper roller 132 to move vertically upward in order to allow the PCB 14 to pass through. The secondary part 112 will consequently move vertically upward relative to the primary part, in response to upward movement of the upper roller 132. This allows the upper roller 132 to continue rotation about its axle 130. When the PCB 14 leaves the space between the rollers 128 and 132, the upper roller 132 will fall back to its original lowest position.

By way of such an arrangement, substrates of different thickness can be processed by the same machine 10, without having to change any of its components. It can also be seen that despite the upward movement of the upper roller 132, the tongue 120 still extends below and seals the elongate opening 116 of the primary part 110, and prevents the electrolyte from escaping out of the machine 10.

It should be understood that the above only illustrates an example whereby the present invention may be carried out, and that various modifications and alterations may be made thereto without departing from the spirit of the invention.

What is claimed is:

1. An apparatus for mixing at least one solid chemical with a solution passing therethrough, which apparatus comprising a container with outer wall means and a longitudinal axis, an input end for receiving said solution from an external source into said container, an output end for allowing said solution to exit said apparatus, and an opening for receiving said chemical into said container, wherein said container comprises an inner porous wall means defining a cavity to which said solid chemical is receivable, wherein said porous wall means are provided with at least a first fixed aperture means and a second fixed aperture means wherein each of said aperture means comprises at least one aperture, a porosity of the wall being defined by the first and second aperture means, and wherein the orientation between the longitudinal axis of the aperture of said first aperture means and a plane containing said respective aperture and said longitudinal axis of said container is different from the orientation between the longitudinal axis of the respective aperture of said second aperture means and a plane containing said respective aperture and said longitudinal axis of said container.

2. An apparatus according to claim 1 further characterized in that said first aperture means is positioned above said second aperture means.

3. An apparatus according to claim 1 or 2 further characterized in that said first aperture means comprises a plurality of apertures.

4. An apparatus according to claim 1 further characterized in that said second aperture means comprises a plurality of apertures.

5. An apparatus according to any one of claim 1 further characterized in that the longitudinal axis of said respective aperture of said first aperture means lies substantially on a plane containing said respective aperture and said longitudinal axis of said container.

6. An apparatus according to any one of claim 1 further characterized in that the longitudinal axis of said respective aperture of said second aperture means intersects a plane containing said respective aperture and said longitudinal axis of said container.

7. An apparatus according to any one of claim 1 further characterized in that the longitudinal axis of said respective aperture of said second aperture means intersects a plane containing said respective aperture and said longitudinal axis of said container at substantially 45°.

8. An apparatus according to any one of claim 1 further characterized in that said solution is delivered into said container at an angle to the plane containing said longitudinal axis of said container and said input end, and thereby to cause said solution to rotate in said container.

9. An apparatus according to claim 8 further characterized in that said angle is substantially 90°.

10. An apparatus to claim 1 further characterized in that said second aperture means allows entry of said solution into said cavity.

11. An apparatus according to claim 1 further characterized in that said first aperture means allows exit of said solution from said cavity.

12. An apparatus according to claim 1 which forms a portion of an electroplating machine.

13. An electroplating machine including an apparatus for mixing at least one solid chemical with a solution passing therethrough, which apparatus comprising a container with outer wall means and a longitudinal axis, an input end for receiving said solution from an external source into said container, an output end for allowing said solution to exit said apparatus, and an opening for receiving said chemical into said container, characterized in that said container comprises inner porous wall means defining a cavity to which said solid chemical is receivable, and that there are provided on said porous wall means at least a first aperture means and a second aperture means wherein each of said aperture means comprises at least one aperture, wherein the orientation between the longitudinal axis of the aperture of said first aperture means and a plane containing said respective aperture and said longitudinal axis of said container is different from the orientation between the longitudinal axis of the respective aperture of said second aperture means and a plane containing said respective aperture and said longitudinal axis of said container.

* * * * *